United States Patent
Landes et al.

(10) Patent No.: US 10,903,833 B2
(45) Date of Patent: Jan. 26, 2021

(54) CONTINUOUSLY CORRECTING CAPACITOR SWITCH CONTROLLER SYSTEM AND METHOD

(71) Applicant: Valquest Systems, Inc., Richardson, TX (US)

(72) Inventors: James L Landes, Richardson, TX (US); Evan Fritts, Richardson, TX (US)

(73) Assignee: VALQUEST SYSTEMS, INC., Richardson, TX (US)

( * ) Notice: Subject to any disclaimer, the term of this patent is extended or adjusted under 35 U.S.C. 154(b) by 14 days.

(21) Appl. No.: 15/836,664

(22) Filed: Dec. 8, 2017

(65) Prior Publication Data
US 2019/0181851 A1  Jun. 13, 2019

(51) Int. Cl.
| | | |
|---|---|---|
| H01H 3/54 | (2006.01) |
| H03K 17/13 | (2006.01) |
| H02M 1/08 | (2006.01) |
| H02J 3/18 | (2006.01) |

(52) U.S. Cl.
CPC .............. *H03K 17/13* (2013.01); *H01H 3/54* (2013.01); *H02M 1/083* (2013.01); *H02J 3/18* (2013.01)

(58) Field of Classification Search
CPC ................................. H03K 17/13; H01H 3/54

USPC ................................................. 307/116, 139
See application file for complete search history.

(56) References Cited

U.S. PATENT DOCUMENTS

| | | | | |
|---|---|---|---|---|
| 3,859,564 A * | 1/1975 | Zulaski | H02H 3/353 361/17 |
| 5,361,184 A * | 11/1994 | El-Sharkawi | H01H 9/56 361/2 |
| 8,090,548 B2 * | 1/2012 | Abdennadher | G01R 27/2605 702/58 |
| 9,613,539 B1 * | 4/2017 | Lindskog | B64D 17/80 |
| 2009/0284334 A1 * | 11/2009 | Kim | H01H 33/38 335/185 |
| 2014/0132373 A1 * | 5/2014 | Takahashi | H01H 33/6662 335/170 |
| 2014/0158665 A1 * | 6/2014 | McCord | H01H 33/168 218/143 |
| 2014/0306549 A1 * | 10/2014 | Gerovac | H02J 3/1821 307/109 |
| 2018/0180167 A1 * | 6/2018 | Peterson | F16H 61/08 |

* cited by examiner

*Primary Examiner* — Adi Amrany
(74) *Attorney, Agent, or Firm* — Singleton Law, PLLC; Chainey P. Singleton

(57) ABSTRACT

A control device for commercially available high voltage capacitor switches to close the circuit on electric utility power factor correction shunt capacitors or motor start assistance shunt capacitors precisely as each phase of the AC power source passes through zero volts.

9 Claims, 16 Drawing Sheets

CONTINUOUSLY CORRECTING CAPACITOR SWITCH CONTROLLER SYSTEM AND METHOD

TECHNICAL FIELD

This application relates to the field of electrical switch control systems. More specifically, the present disclosure relates to systems and methods for control and continuous calibration of high voltage capacitor switches.

BACKGROUND

Installation of capacitor banks associated with a power grid has become necessary in order to provide power factor correction in response to the introduction to the grid of heavy industrial inductive loads. Medium voltage applications (2.4 kV-35 kV AC) can include capacitors that are switched according to power factor correction needs. If such introduced loads are out of phase, additional reactive currents increase transmission losses which results in wasted energy. This results in additional generating capacity requirements.

In some capacitor switch control systems, the voltage-to-current phase relationship is measured and the capacitor switch is controlled accordingly.

Switch closure at a time when the AC voltage across the switch is at a value other than zero, a spike in current results. Such an increase in current causes undesired results such as voltage spikes, dips, harmonics, resonance peaks or other negative impacts on the electrical system. These phenomena can damage or degrade performance of user equipment.

Some switching systems include a resistor placed in series with the switch to reduce the spike in current. This approach is adequate for some users but not others.

Capacitor switch controllers that require switching to the closed position when the voltage across the capacitor switch is at virtually zero volts are difficult to install, maintain and calibrate.

Prior art auxiliary micro-switches operated by the control mechanism in the switch was relied upon for calibration sensing and minor operational adjustments over time. The problem with this approach is that the micro-switch action is not always consistent and has a tendency to move out of adjustment. Further, switch adjustment and calibration at the switch side, which is typically mounted high above ground, requires disconnection of capacitor fuses and extensive resources in terms of manpower and equipment, such as a bucket truck. There is a need, therefore, for an efficient controller side system and method for continuous correction or adjustment of capacitor switch control systems to bring and keep the timing of switching as close to zero volts (ac) as possible.

Also, prior art systems have been neither accurate nor reliable. Accuracy could not be maintained over long periods. Calibration was time consuming and the risk of having to repeat the procedure was high. As a result, establishing and maintaining switching at the time of zero volts (ac) is difficult and costly.

BRIEF DESCRIPTION OF DRAWINGS

The novel features believed characteristic of the invention are set forth in the appended claims. The invention itself, however, as well as a preferred mode of use, further objectives and advantages thereof, will be best understood by reference to the following detailed description of illustrative embodiments when read in conjunction with the accompanying drawings, wherein:

DETAILED DESCRIPTION

Figure 1:
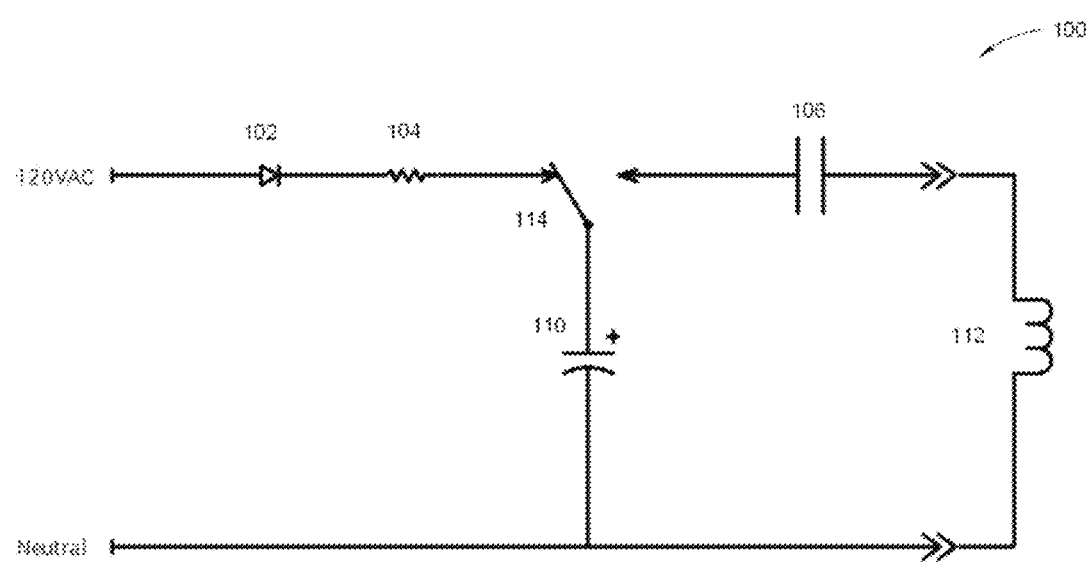
FIG. 1 is a circuit diagram for operation of an embodiment of the presently described capacitor switch control system.

Before undertaking the detailed description below, it may be advantageous to set forth definitions of certain words and phrases used in connection to the disclosed exemplary embodiments: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Although the subject matter of this application has been described with reference to illustrative embodiments, this description is not intended to be construed in a limiting sense. Various modifications and combinations of the illustrative embodiments as well as other embodiments will be apparent to persons skilled in the art upon reference to the description. It is, therefore, intended that the appended claims encompass any such modifications or embodiments. This general processes and systems described herein may be modified heavily depending on a number of factors, with rearrangement and/or addition/deletion of steps anticipated by the scope of the present disclosure. Integration of this and other preferred exemplary embodiment methods in conjunction with a variety of preferred exemplary embodiment systems described herein is anticipated by the overall scope of the presently disclosed system.

The present disclosure describes a control system and method for operating commercially available high voltage capacitor switches to close the circuit on electric utility power factor correction shunt capacitors or motor start assistance shunt capacitors precisely as each phase of the AC power source passes through zero voltages. In one embodiment, the control system receives commands to open or close the switches from an external device. The present system operates the switches in a manner such that the main contacts of each switch close precisely as the AC voltage across the switch passes through zero volts. The present system is continuously calibrating, providing compensation for temperature at both the switch and controller side of the system.

The voltage range for the presently described switches is typically from 2,400 to 35,000 VAC. According to IEEE standards, switch closure must occur within 1 millisecond of the voltage zero cross.

Prior art devices used an auxiliary micro-switch operated by the control mechanism in the switch for calibration sensing and minor operation adjustments over time. The primary flaw in such systems is that the micro-switch action is not always consistent and has a tendency to move out of adjustment.

The present capacitor switch control system, however, does not use a micro-switch but instead leverages the signature of current in the solenoid coil to determine the end-of-travel of the control mechanism. This approach of the presently described system affords the several improvements over prior art. First, use of the current signature in the solenoid is much more precise and repeatable than the micro-switch method. Second, the time from contacts closing to mechanism end-of-travel is minimal when compared to overall closing time and variations that may be experienced during this time span are much less significant than those experienced during the entire closing time of the switch. Third, with no micro-switch mechanism, re-calibration of a micro-switch mechanism is not required.

The presently described system and method includes monitoring of both switch temperature and controller temperature. Empirically determined temperature curves stored in the controller's memory provide for compensation and adjustment for temperatures at both ends of the control cable. This type of temperature compensation is necessary for maintaining accuracies within the IEEE guidelines over a wide range of temperatures.

In one embodiment, a neutral sense circuit for monitoring capacitor current in the neutral of a grounded wye capacitor bank or voltage from center to neutral in an un-grounded wye capacitor bank is provided. The neutral sense circuit eliminates the need of connecting clip leads to the capacitor switch terminals in order to monitor timing of contact closure, disconnection of the capacitor fuses, and typical use of a bucket truck and associated personnel. Also, knowledge of phase rotation is no longer needed for proper controller function.

The neutral sense circuit of the present capacitor switch controller system and method enables detection of switch closing times by observing the discontinuity in capacitor current (or center point voltage). At the same time improved and ongoing accuracy assessment is provided. Phase rotation information is made available by comparing current waveforms to voltage waveform, eliminating the risk of improperly assigning phase rotation. Overall, a more consistent calibration procedure is provided.

FIG. 1 is a schematic of circuitry of the present capacitor switch control unit. In FIG. 1, circuit 100 includes a 120 volt AC voltage source associated with diode 102 connected in series with resistor 104. SPDT mechanical relay 114 (shown de-energized) is a switch between electrolytic capacitor 110 and solid state relay 106 (shown de-energized). Solid state relay 106 is connected in series with operating solenoid 112 used to close a high voltage switch.

In a charging mode of operation of circuit 100, the 120 volt AC source is used to charge electrolytic capacitor 110 through diode 102, resistor 104 and SPDT mechanical relay 114. In a closing mode of operation of circuit 100, SPDT mechanical relay 114 is operated to the energized position and a calculated time delay occurs. Solid state relay 106 is operated to the closed state and current flows from electrolytic capacitor 110, through SPDT mechanical relay 114 and solid state relay 106, causing operating solenoid 112 to close the high voltage switch. After a pre-set time delay SPDT mechanical relay 114 and solid state relay 106 return to the de-energized state.

Figure 2:
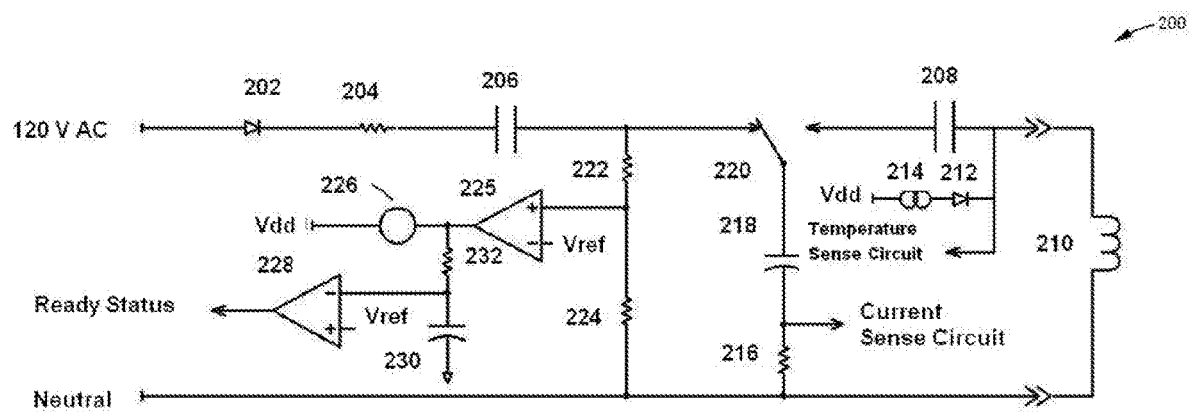
FIG. 2 is a circuit diagram for operation of an embodiment of the presently described capacitor switch control system.

FIG. 2 provides a more detailed view of an embodiment of the capacitor switch circuitry. In FIG. 2, circuit 200 comprises 120 volt AC source and DC Current source 214. The 120 volt AC source is connected to diode 202, which is connected in series to resistor 204 and solid state relay 206 (shown in a de-energized state). SPDT mechanical relay 220 (shown de-energized) is connected to electrolytic capacitor 218, which is connected in series to resistor 216. In charging mode, the circuit 200 of FIG. 2 operates according to FIG. 1 in charging more with the following additional operations.

Analog voltage comparators 225 and 228 are staged whereas comparator 225 operates solid state relay 206, allowing charging of electrolytic capacitor 218 until the correct voltage is reached. Analog voltage comparator 228, resistor 232 and nonpolarized capacitor 230 form a detector to provide a "ready" status to the microprocessor of the control unit.

Resistors 222 and 224 form a resistor divider to produce a sense voltage for DC voltage source provided by capacitor 218. DC current source 214 sends current through diode 212 and operating solenoid 210 of high voltage switch. Resistance of solenoid 210 is used to measure relative solenoid temperature. The microprocessor of the control unit uses this temperature measurement for temperature compensation.

In closing mode, circuit 200 behaves similarly to closing mode of circuit 100 described above with reference to FIG. 1. Additionally, electrolytic capacitor 218 provides a precise amount of energy to solenoid 210 because of the precise voltage level. SPDT mechanical relay 220 and solid state relay 208 will not operate if the "ready" status is not active. Resistor 216 provides current information for solenoid 210 to the microprocessor of the control unit during switch closing.

For three phase operation, three circuits such as circuit 200 are provided, one for each phase. Each phase is operated one at a time and a delay period occurs between phase operations.

The time at which AC voltage is zero for switching is detected using a voltage divider and an analog comparator. In one embodiment, the signal is a 60 Hz square wave with edges at the zero crosses. Zero cross detection is referred to as point Z as shown in FIG. 4D.

Figure 3:
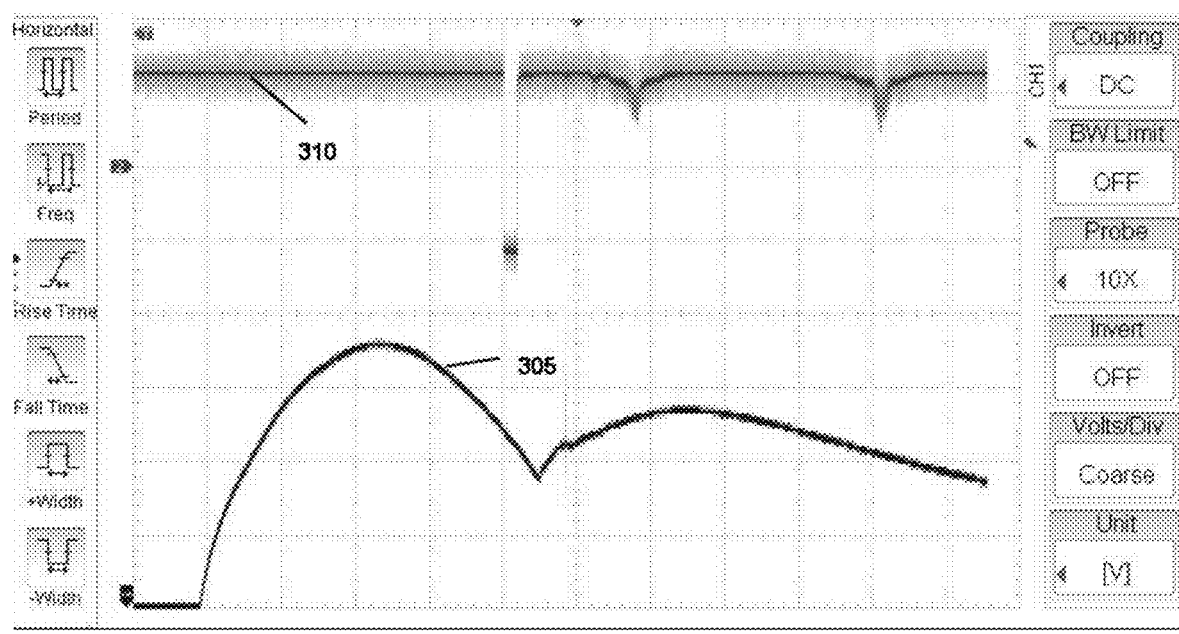
FIG. 3 is a graphic depiction of current in the capacitor switch solenoid and induced capacitor current spike according to an embodiment of the presently described capacitor switch control system.

In FIG. 3, trace 305 reflects current values in the switch solenoid 112 of FIG. 1 during close. This current is a function at any instant of voltage on electrolytic capacitor 110, existing solenoid 112 current, resistance of the solenoid 112 coil, inductance of the solenoid 112 coil, back EMF of the solenoid based on solenoid core velocity, the time derivative of solenoid 112 current that is proportional to applied voltage, and effective voltage on the solenoid 112, that is, the voltage on electrolytic capacitor 110.

In FIG. 3, the lower left portion of the graph shows where solid state relay 106 of FIG. 1 is fired. At the time relay 106 is fired, the current increases rapidly from zero (di/dt). In one embodiment, eleven (11) milliseconds after relay 106 is fires the current peaks due to decreasing voltage on capacitor 110 and increasing back EMF in solenoid coil 112. After this point, di/dt is negative for approximately eleven (11) milliseconds. At twenty two (22) milliseconds after solid state relay 106 fires, di/dt makes a step function to distinctly positive. This is caused by the solenoid 112 stopping at the travel limit where back EMF abruptly goes to zero. This transition to positive marks the time of the end of travel of solenoid 112. This in turn allows monitoring of this most significant timing component at a low voltage level. The leading edge of trace 310 in FIG. 3 depicts switch contacts initial closing as monitored by neutral CT with signal conditioning.

Figure 4A:
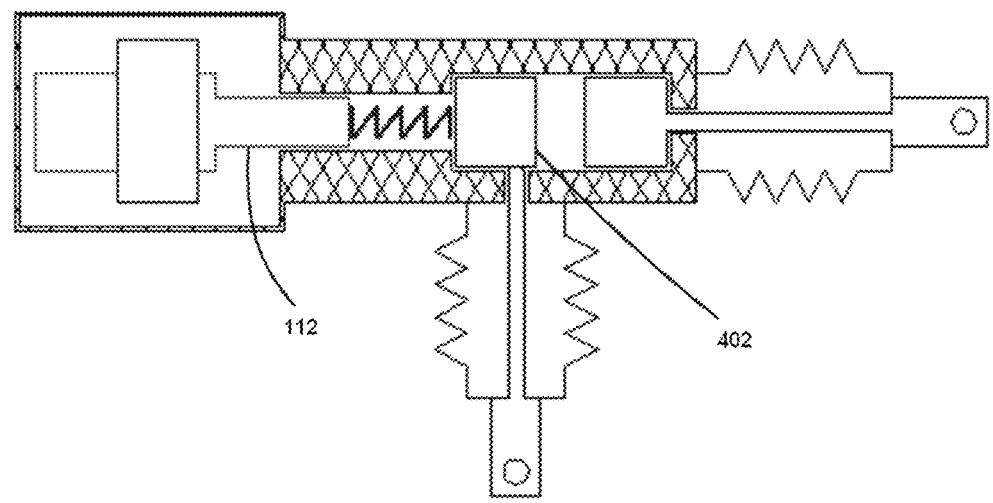
FIG. 4A depicts a solenoid switch according to an embodiment of the presently described capacitor switch control system.
Figure 4B:
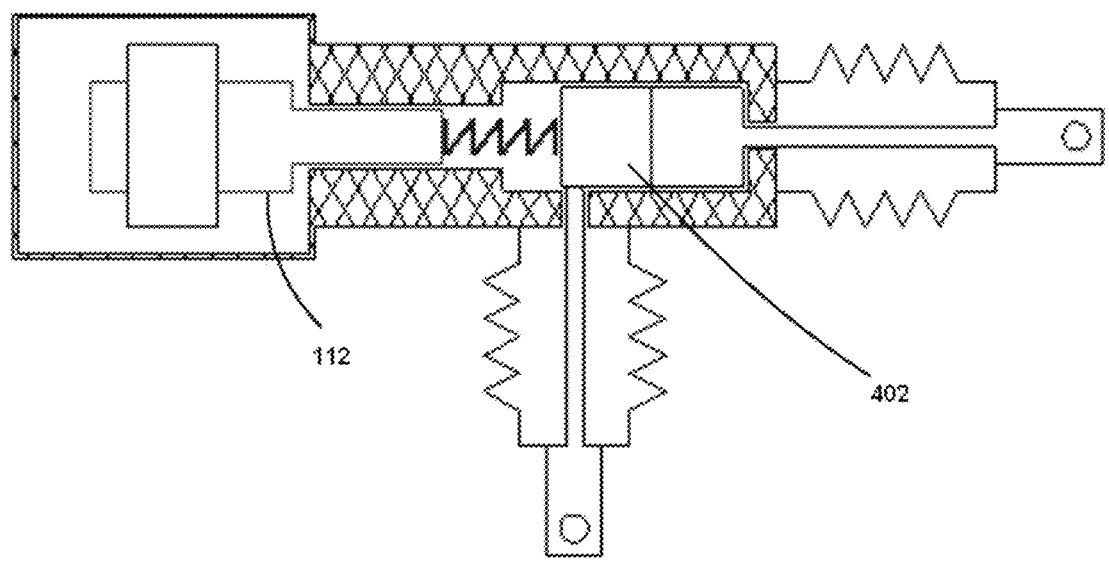
FIG. 4B depicts a solenoid switch in transition according to an embodiment of the presently described capacitor switch control system.
Figure 4C:
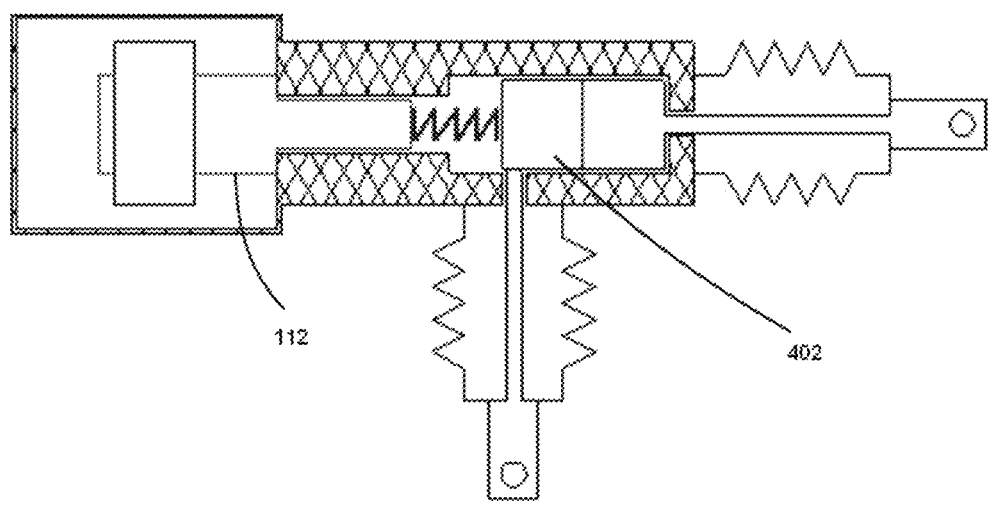
FIG. 4C depicts a solenoid switch at the point of its end of travel according to an embodiment of the presently described capacitor switch control system.
Figure 4D:
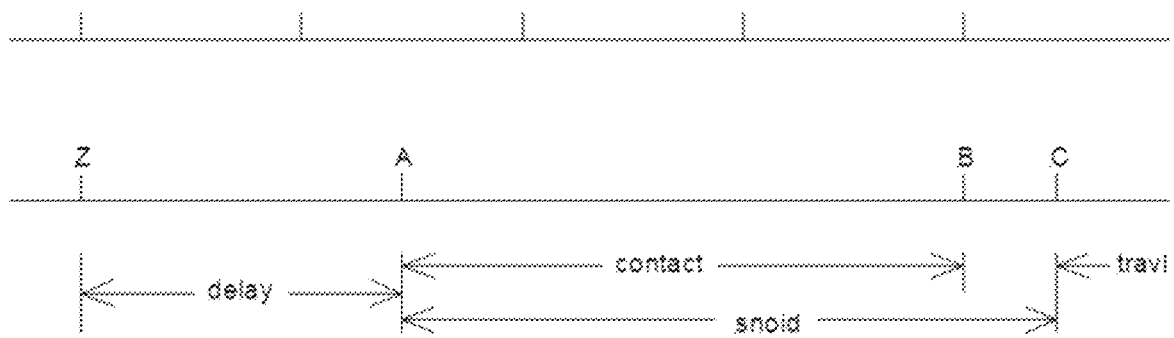
FIG. 4D is a graphic depiction of zero cross voltage timing of capacitor switch closure according to an embodiment of the presently described capacitor switch control system.

FIGS. 4A-4C depict the closing operation of solenoid 112. FIG. 4A shows solenoid switch 402 in a full open position as the relay of solenoid 112 is fired. FIG. 4B depicts solenoid 112 in transitions as switch 402 makes initial contact. FIG. 4C depicts 112 at the end of its path of travel, while switch 402 remains closed.

FIG. 4D reflects the timing of various events with reference to the firing of relay 106 in FIG. 1. In one embodiment, the values as reflected in FIG. 4D are stored in memory associated with the control unit as measured during calibration. In FIG. 4D, 'snoid' refers to the time span from firing of relay 106 (point A) in FIG. 1 until switch solenoid 112 reaches the end of its travel (point C). The term 'trawl' refers to the time from switch contacts "making up" or make initial contact (point B) until the solenoid 112 reaches the end of its travel (point C). The term 'contact' refers to the period from the time of firing relay 106 until switch contacts make up. Thus, contact=snoid−travl. This sequence is repeated for each phase.

The value 'delay' is the time from detection of the zero cross (point 'Z') to the time of firing relay 106. The value 'delay' is calculated by the following steps. First, n is determined, which is a multiple of line frequency half-cycles. The value of n must exceed the maximum expected contact time. Time Tnhc is determined for the n half-cycles based on line frequency. The value of 'contact' is calculated as described above as 'snoid' minus 'trawl'. The value 'delay', therefore, is Tnhc minus 'contact'.

The presently described capacitor switching control system provides greater zero voltage closing accuracy through use of temperature compensation. In one embodiment, four sets of regression constants are stored based on empirical temperature testing. A temperature curve for the 'snoid' for the solenoid operated capacitor switches is stored. A temperature curve for snoid for the closing capacitors such as capacitor 110 in FIG. 1 is stored. A temperature curve for the 'travl' term calculated as provided above for the solenoid operated capacitor switches is stored. A temperature curve for the 'travl' term calculated for the closing capacitors such as capacitor 110 in FIG. 1 is stored. These curves are applied to both 'snoid' and 'travl' calculations before closing. The temperature of the switches is monitored and averaged using the circuit in FIG. 2. Temperature of the closing capacitors is monitored and averaged using a sensor in the cabinet.

Timing adjustments are made as over time the switch mechanism will change at least a small amount, changing contact time. Zero voltage closing accuracy is enhanced by monitoring close times and modifying constants. The 'snoid' value is measured on each close and constants are slightly modified accordingly. Since the 'travl' value remains virtually constant relative to temperature, modification is not necessary.

Additional operations of the present capacitor switch control system are described below.

Figure 5A:
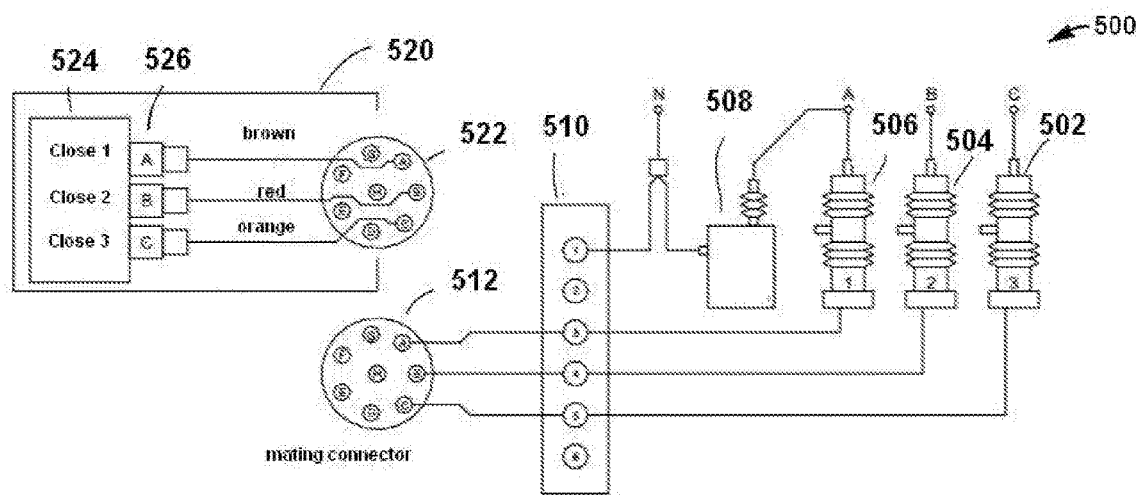
FIG. 5A is a diagram of the presently described capacitor switch control system according to an embodiment of switch closure connections.

FIG. 5A depicts an embodiment of the present capacitor switch control system. Capacitor switch system 500 comprises a capacitor bank including three medium voltage capacitor switches 502, 504 and 506. A transformer 508 is connected to the first closing circuit and they are on the same phase according to one embodiment. Switches 502, 504 and 506 and transformer 508 are connected to a junction box 510. Switches 502, 504 and 506, transformer 508 and junction box 510 are commonly located on poles high above ground. Junction box 510 enables connection of the switches 502, 504 and 506 to mating connector 512 located at or close to ground level. Mating connector 512 in one embodiment includes a number of pins, such as eight. Control unit 520 includes enclosure connector 522 for receiving mating connector 512 and providing an interface between switches 502, 504 and 506 and the microprocessor 524 of control unit 520. Control unit 520 includes swapping jacks 526 for easy switching of connectors at ground level in the case of incorrect connection of cables for switches 502, 504 and 506 high above ground.

Capacitor Bank Configurations. Different capacitor bank configurations each call for a different set of timing parameters to be stored for zero voltage closing. The configurations can be defined with three characteristics: (a) phase rotation (1-2-3 or 3-2-1); (b) Grounded Wye, un-grounded Wye or delta; or (c) phase relation of the voltage reference (control power transformer connected phase-neutral or phase-phase). A delta configuration is handled in a manner similar to an un-grounded Wye. The rotation does not need to be known when the configuration is delta or un-grounded Wye. The control unit 520 closes the switches 502, 504, and 506 in order of 1 first, then 2, then 3. In the configurations below the control power transformer (CPT) must be connected to the phase(s) connected to the indicated switches. The control unit switch connection modifications can be made via the enclosure connector 522 at ground level, if necessary.

Standard Capacitor Bank Configurations. As seen in FIG. 5A, the control will operate only the switch 502 closing circuit in a single phase configuration. For three phase grounded Wye 1-2-3 rotation with CPT on 1-N switch 502 closes at the zero crossing of the reference voltage, switch 504 closes at the zero crossing of the reference voltage plus 120 degrees, and switch 506 closes at the zero crossing of the reference voltage plus 60 degrees.

For three phase grounded Wye—3-2-1 rotation with CPT on 1-N closes switch 502 closes at the zero crossing of the reference voltage, switch 504 closes at the zero crossing of the reference voltage plus 60 degrees and switch 506 closes at the zero crossing of the reference voltage plus 120 degrees For three phase grounded Wye—1-2-3 rotation with CPT on 1-2, switch 502 closes at the zero crossing of the reference voltage plus 30 degrees switch 504 closes at the zero crossing of the reference voltage minus 30 degrees and switch 506 closes at the zero crossing of the reference voltage plus 90 degrees.

For three phase grounded Wye—3-2-1 rotation with CPT on 1-2 switch 502 closes at the zero crossing of the reference voltage minus 30 degrees, switch 504 closes at the zero crossing of the reference voltage plus 30 degrees and switch 506 closes at the zero crossing of the reference voltage plus 90 degrees. For three phase un-grounded Wye or Delta with CPT on 3-N, switch 502 closes at the zero crossing of the reference voltage, switch 504 closes at the zero crossing of the reference voltage plus 90 degrees, and switch 506 closes at the zero crossing of the reference voltage. For three phase un-grounded Wye or Delta with CPT on 1-2, switch 502 closes at the zero crossing of the reference voltage, switch 504 closes at the zero crossing of the reference voltage, and switch 506 closes at the zero crossing of the reference voltage plus 90 degrees.

Figure 5B:
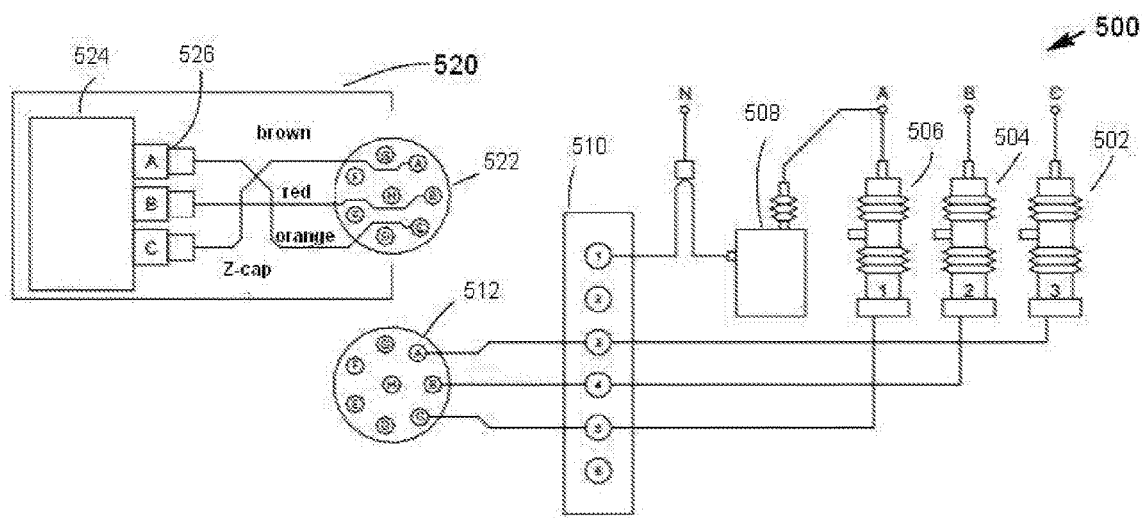
FIG. 5B is a diagram of the presently described capacitor switch control system according to an embodiment of switch closure connections.
Figure 5C:
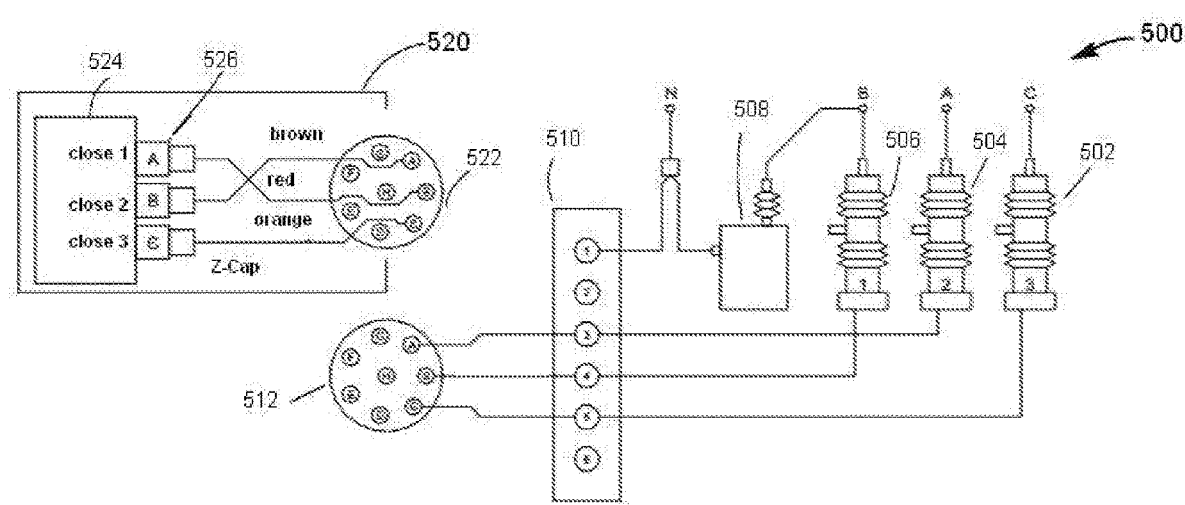
FIG. 5C is a diagram of the presently described capacitor switch control system according to an embodiment of switch closure connections.

Modified Closing Connections. At times, the wiring of capacitor switches 502, 504 and 506 wiring is not aligned properly with the transformer for the bank configuration. Inside the control unit enclosure are switch swapping jacks 526. In one embodiment, swapping jacks 526 are labeled A, B and C. Because the switch closing order is always 1-2-3, the switches must be connected in positions relative to the transformer. When the switches are improperly connected, swapping jacks 526 provide an easy way to correct the wiring. FIG. 5A as described above depicts the normal (factory wired) setup. FIGS. 5B and 5C each depict an example of a modified set up. FIG. 5B shows a situation where the bank has been wired so that the third closing circuit of switch 506 is connected to the phase that transformer 508 is on. The Brown and Orange wire have been swapped in control unit 520 to correct it.

FIG. 5C shows an arrangement where the bank has been wired so that the second switch 504 is connected to 'A' on 510 and switch 506 is connected to 'B' on 510. The brown and red wires have been swapped in control unit 520 to correct this. These corrections are done completely irrespective of the utility's phase references. A, B, and C have no meaning to control unit 520 except as it affects phase rotation.

Determining Phase Rotation. Phase Rotation is called A-B-C if B peaks after A, and C peaks after B. The opposite is called C-B-A. In the case of the control unit, it is called 1-2-3. The opposite rotation is 3-2-1. When the capacitor bank configuration is wired as a grounded wye, the phase rotation must be known.

Assuming that the utility personnel know the phase rotation and can identify the phases, the rotation as it relates to control unit can be determined. For instance if control unit circuits are as follows: (a) switch 502 connected to Phase A; (b) switch 504 connected to Phase B; and (c) switch 506 connected to Phase C, then utility rotation is A-B-C and control unit 520 rotation is 1-2-3. This is the case shown in the system of FIG. 5A. Similarly, FIG. 5B has this same arrangement after swapping the brown and orange wires in control unit 520. So once again if utility rotation is A-B-C, control unit 520 rotation is 1-2-3. Of course if utility rotation is C-B-A then control unit rotation is 3-2-1. In FIG. 5C, the phases are not 1 to A, 2 to B, and 3 to C. If utility rotation is A-B-C then control unit 520 rotation is 2-1-3, which is effectively 3-2-1. If utility rotation is C-B-A, then control unit 520 rotation is 1-2-3.

Correct control unit rotation is important for Grounded Wye banks because incorrect rotation will result in a closing point far from zero. This is due to the closing angles being 120 degrees apart. For instance, if the phase connected to switch 504 of FIG. 5A crosses 0 volts 120 degrees after the phase on switch 502 (rotation=1-2-3) but if switch 504 closes at 240 degrees after switch 502, the voltage will be at 0.867 of crest rather than 0. With Un-Grounded Wye banks and Delta banks it is not necessary to know rotation. This is because there is no current when switch 502 closes and switches 504 and 506 close 90 degrees apart. If the rotation is backwards it has the effect of making the requirement −90 degrees, but 90 degrees and −90 degrees are 180 degrees apart.

Zero Voltage Closing. In one embodiment, the presently described capacitor switch control system accepts Close and Trip commands in the form of 120 VAC signals from any external control device such as a PLC or standard capacitor control. Input signals are opto-coupled to insure reliability of the system. The system provides a wetting voltage, which the controlling device can use if necessary. When a Close command is received a separate close operation is initiated for each phase. These operations are timed so that each switch's main contacts make initial contact as close to zero crossing as possible. Zero crossing is defined as the time (two per cycle) when the phase conductor is at neutral potential (phase to neutral PT) or when the two phase conductors are at precisely the same potential (phase to phase PT).

Constant Close Operation Control Voltage. In order to close the entire capacitor bank in a timely manner, each capacitor switch is provided with its own stored energy circuit. These circuits include charged capacitors. The voltage on these capacitors is maintained to within 0.1 volts and is monitored constantly. As long as the capacitor voltage is within tolerance, the "READY" LED on the control unit will be lit, indicating that the capacitors are charged and ready for operation. A set of dry contacts will also be closed to indicate this condition to the external control unit. The Close sequence cannot be initiated while the capacitor voltages are out of tolerance.

Capacitor Temperature Compensation. Because energy storage in a capacitor changes slightly with temperature, close timings change slightly with internal capacitor temperature. The microprocessor of the presently described system constantly monitors the temperature inside the enclosure and adjusts the Close Sequence timings for each phase based on stored energy curves. Time integration is used to allow for the lag between board temperature and internal capacitor temperature.

Switch Temperature Compensation. The primary temperature variable that affects Close timing accuracy is the capacitor switch solenoid temperature. The present capacitor switch controller incorporates techniques to precisely monitor the switch temperature and adjust the Close Sequence timing accordingly.

Automated Close Time Calibration. Before the control is ready for normal operation, each switch circuit must be calibrated. Calibration can be done using switches on the front panel of the control unit or with a laptop computer. Using a laptop is preferable because it is automatic and allows archiving of calibration data. For each phase, the user connects the calibration cables to the switch terminal (without high voltage applied) and sets the front panel switches to the proper position. The calibration sequence begins using the control unit's companion software. The user through a remote device such as a laptop computer will take each switch through three complete operations during which the precise timings are monitored and stored in the control unit's non-volatile memory. This sequencing can also be performed directly from the control unit's user interface located on, for example, the front panel.

Calibration Data Storage. During calibration the timing parameters for each switch (including reference temperatures) are stored both in non-volatile memory in the control unit. During power losses the control unit will retain these settings.

Automatic Close Timing Adjustment. During every close sequence control unit 520 of the present system uses and incorporates neutral sense circuitry as described in more detail below with respect to FIGS. 7-12 to monitor the motion of each switch solenoid. FIG. 2 monitors the motion of the switch solenoid. FIGS. 7-12 show example waveforms and example circuitry that cover charging of capacitors and determining the actual switch contacts closure using neutral current as feedback. In conjunction with the calibration data this gives the microprocessor 524 of control unit 520 precise information with which to make slight adjustments to the stored timing parameters. This means that over long periods of time the zero voltage closing accuracy will be maintained.

Switch Status Indication. The trip circuit is continuously monitored to determine if the capacitor switches are closed or open. This is done without using any auxiliary switches and gives an absolute indication at the "STATUS" LED on the front panel of the bank status. A set of dry contacts also indicates this status to the external control unit.

RS-232 Communications. The controller incorporates a 9 pin D type connector to communicate via RS-232 to a laptop with the system's companion software installed. This allows for automated Calibration, Switch Testing, Data retrieval, Digital Close/Trip/Status.

Installation of Capacitor Switches. In one embodiment, the capacitor switches are solenoid operated switches configured for ZVC operation. That is, the switches are internally wired such that the trip solenoid has a standard micro-switch installed that interrupts the trip signal after the main contacts have opened. The close solenoid must be wired directly to the connector with no interposing micro-switch.

AC Power. In one embodiment, the present capacitor switch control system operates on 120V AC at 60 Hz. This voltage is normally supplied from a control transformer, provided through the seven pin Amphenol connector 522 of FIG. 5A located on the bottom of control unit 520. This transformer provides the power for charging the closing capacitors, the power for tripping the main switches and a reference voltage for calculating the voltage zero cross timing. In order for the controller to operate properly, the primary of this transformer must be wired between neutral and the same phase as the switch that is controlled by switch 502 closing circuit in control unit 520 or between the two phases that correspond to the switches being controlled by switch 502 and switch 504 closing circuits in control unit 520.

Figure 6A:
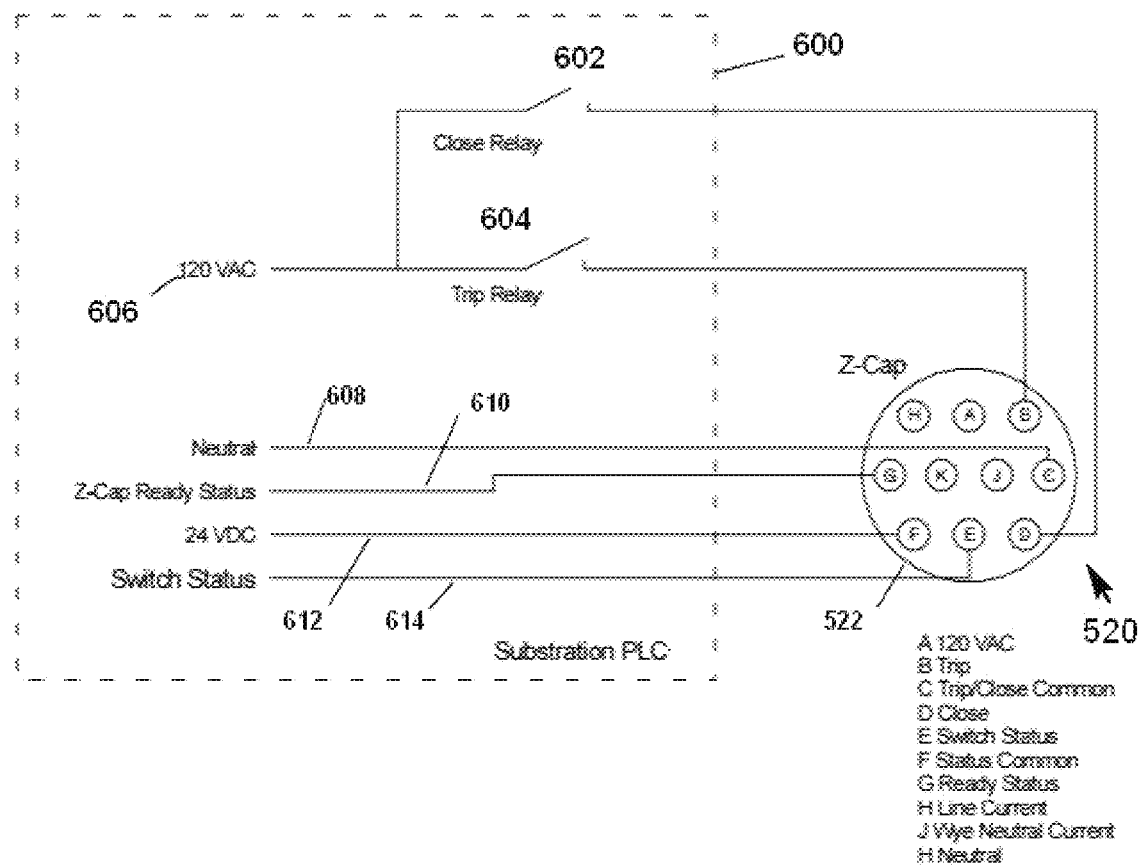
FIG. 6A is a diagram of a capacitor switch control scheme according to an embodiment of the presently described capacitor switch control system.
Figure 6B:
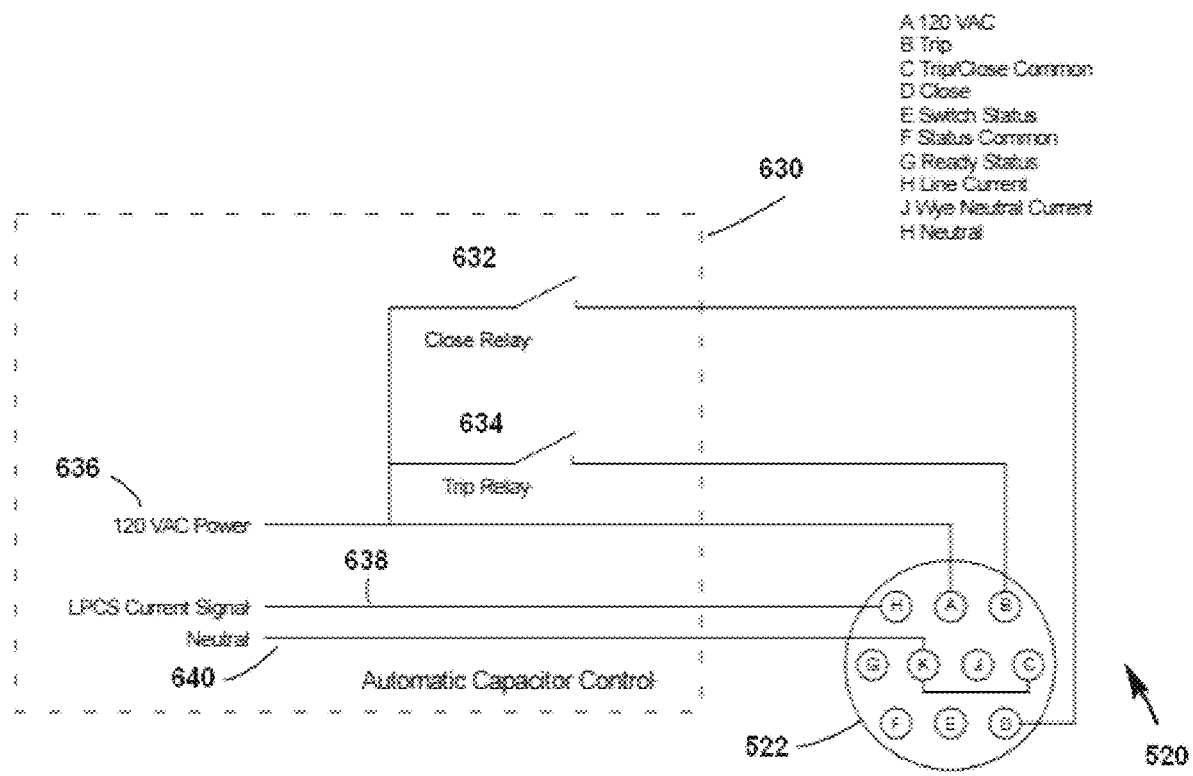
FIG. 6B is a diagram of a capacitor switch control scheme according to an embodiment of the presently described capacitor switch control system.

Control Schemes. There are many command schemes that can be implemented in the presently described capacitor switch control unit. FIGS. 6A and 6B show two common schemes, one for a PLC and one for an Automatic Capacitor Control being powered from the control unit. In FIG. 6A, PLC 600 is powered by control unit 520 and interfaces with control unit 520 via enclosure connector 522. Enclosure connector 522 includes numerous pins to which various lines are connected. Close relay 602 is connected to pin D of connector 522 and trip relay 604 is connected to pin B of connector 522. Line 608 is a trip/close common wire connected to pin C. A 24 V (dc) source 612 is connected to pin and is a status common line. Switch status line 614 is connected to pin E.

In FIG. 6B, automatic capacitor control 630 is connected to control unit 520 via connector 522 and its various pins. 120 volt (ac) power source 636 connects at pin A of connector 522. Close relay 632 of automatic capacitor controller is connected to pin D of connector 522. Trip relay 634 is connected to pin B of connector 522. An LPCS current signal 638 connects at pin H of connector 522 and neutral line 640 connects to pins K and C.

Trip Command. The trip command is received as a 120 VAC signal applied between pins B and C of connector 522. The signal lasts between 300 milliseconds and 2 seconds.

Close Command. The Close command is received as a 120 VAC signal applied between pins C and D of connector 522 The signal should last 600 milliseconds and no longer than 2 seconds. Switch Status can be read as a dry contact on pins E and F of connector 522. The dry contact will be closed if any of the capacitor switches are closed. The contact will be open if all of the connected capacitor switches are open. Ready Status can be read as a dry contact on pins G and F of the control connector 522. A closed contact indicates that the closing circuit capacitors are charged and control unit 520 is ready to close the switches.

Calibration. Control unit 520 must be calibrated for all three phases (except when operating as single phase) before it can accurately close switches 502, 504 and 506 relative to the zero voltage points. It must also be set for the proper capacitor bank and voltage sense configuration.

Laptop Field Calibration. For calibration in the field via a personal computing device, such as a laptop computer, the terminals on capacitor switches 502, 504 and 506 are to be disconnected. Calibration cables can be connected to the control unit 520 serial port (DB-9 connector). Two clips on the calibration cables to terminals of the switch being calibrated. The calibrated cable is then connected to the control unit 520 serial port (DB-9 connector) and a serial cable is connected from the calibration cable to the laptop. Companion software on the laptop is run and operates functions stored locally in control unit 520. On the user interface via the display of the laptop, the user then selects a Calibration tab and in turn selects the switch to be calibrated. Once the "calibrate" command is invoked, the software takes the control unit 520 through three complete operations. Upon completion of this operation on the first switch 502, the calibration clips are moved to the next switch 504 and the process is repeated for the remaining switch. Front panel control unit 520 switches are set to the proper positions based on the capacitor bank configuration.

For front panel field calibration the terminals on capacitor switches 502, 504 and 506 are disconnected. The close/trip switch on the front panel of control unit 520 is used to confirm that all the capacitor switches are in the open position. A calibration cable is connected to control unit 520 and in turn this calibration cable is connected to the two terminals of the switch being calibrated.

Using Neutral CT for Switch Calibration and Rotation Determination.

Grounded wye is the most common configuration for non-substation distribution voltage capacitor banks. This concept applies to a grounded wye configured capacitor bank with a phase-neutral reference transformer and a CT around the wire that connects the wye center to neutral. Calibration can also be accomplished with an un-grounded wye bank using a neutral PT using similar techniques. Rotation determination is not necessary for un-grounded wye capacitor banks. For the sake of clarity it is assumed that the reference transformer (PT) is on phase A.

Switch Calibration

When a single energized capacitor switch is closed, a current spike can occur. This spike can be detected in a timely manner using the neutral CT. By monitoring the CT signal the precise close time can be determined relative to the time the signal was sent to the switch solenoid. The circuit will monitor both the CT and PT signals.

Figure 7:
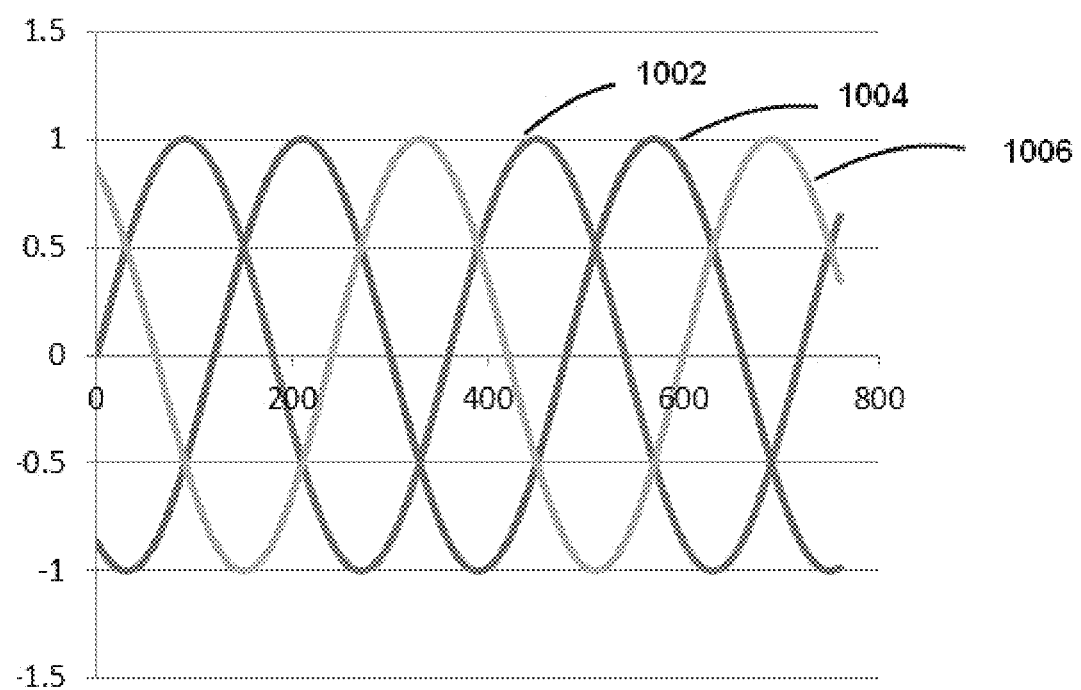
FIG. 7 is a graphic depiction of three phases of primary voltage relative to neutral across energized capacitors according to an embodiment of the presently described capacitor switch control system.

FIG. 7 depicts the phase A PT voltage 1002 and expected voltage B 1004 and voltage C 1006 with ABC rotation. Voltage B 1004 and voltage C 1006 will be reversed if rotation is CBA. In order to get a sufficient calibration signal from the neutral CT, each switch must be closed when the respective voltage is significantly away from zero. A sufficient value is 60 degrees where the voltage will be at 87% of peak. With phase A voltage 1002 this is simplified because that voltage is monitored directly. Note that phases B voltage 1004 and phase C voltage 1006 are both at 87% of peak when phase A voltage 1002 crosses zero.

When closing switch A, therefore, it should close at approximately 60 degrees from zero. When closing B and C switches they should close as phase A crosses zero.

Generally, taking the average of three close timings gives a good calibration. By first operating each switch a single time and taking the time reading (without using it for part of the calibration) a good starting point is provided for the three calibration operations. This extra first operation avoids getting erroneous data by having the first operation too close to zero cross.

It is necessary to know the phase rotation for correct timing of switches B and C in a grounded wye configuration. Many times this is difficult to determine. The neutral CT affords a solution to this problem.

Rotation determination is done by closing each energized capacitor switch separately and observing the Phase A voltage and neutral CT current.

Figure 8:
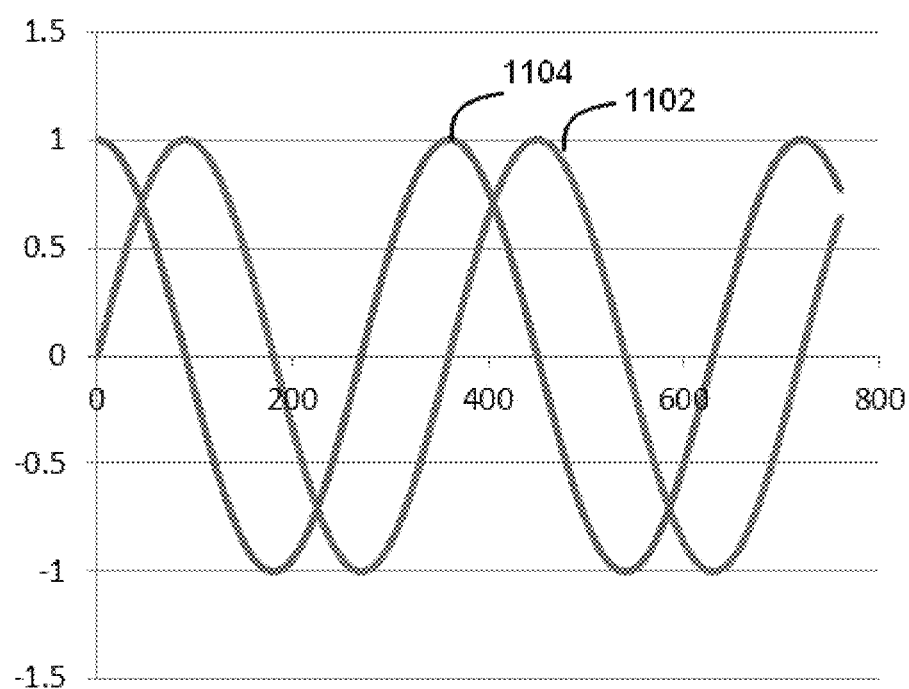
FIG. 8 is a graphic depiction of voltage across a single energized capacitor and the resulting neutral CT current according to an embodiment of the presently described capacitor switch control system.

FIG. 8 depicts voltage A 1102 and neutral CT current 1104 when the phase A switch is closed. This assumes properly polarized PT and CT. The current 1104 is leading the voltage 1102 by ninety degrees. If the CT is accidentally installed backwards, these waveforms will be reversed. The need to have this information will be discussed below. Note that the power calculation for these waveforms renders is approximately zero.

Figure 9:
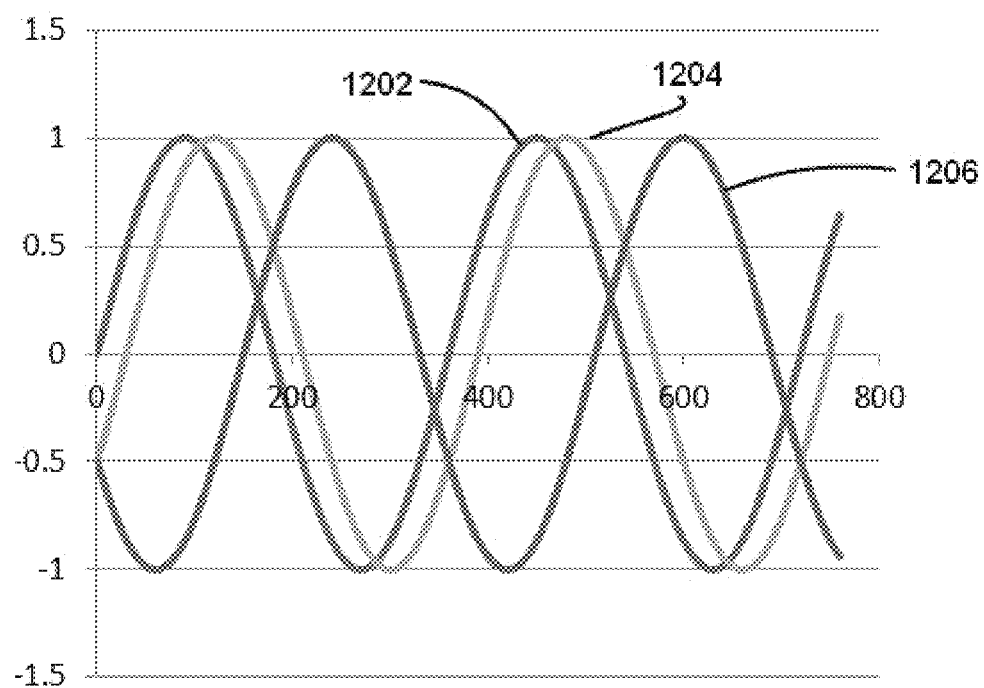
FIG. 9 is a graphic depiction of voltage on the transformer, the voltage across an energized capacitor on a different phase, and the resulting neutral CT current according to an embodiment of the presently described capacitor switch control system.

FIG. 9 depicts Voltage A 1202 with neutral CT current when the B switch and C switch are closed at separate times. This is with rotation ABC. Note that the power calculation for phase A voltage with phase B current 1204 renders a positive result while the power calculation for phase A voltage with phase C current 1206 renders a negative result. In other words the B current 1204 waveform is mostly the same polarity as voltage A 1202 and the C current waveform 1206 is mostly the opposite polarity to voltage A 1202.

Figure 10:
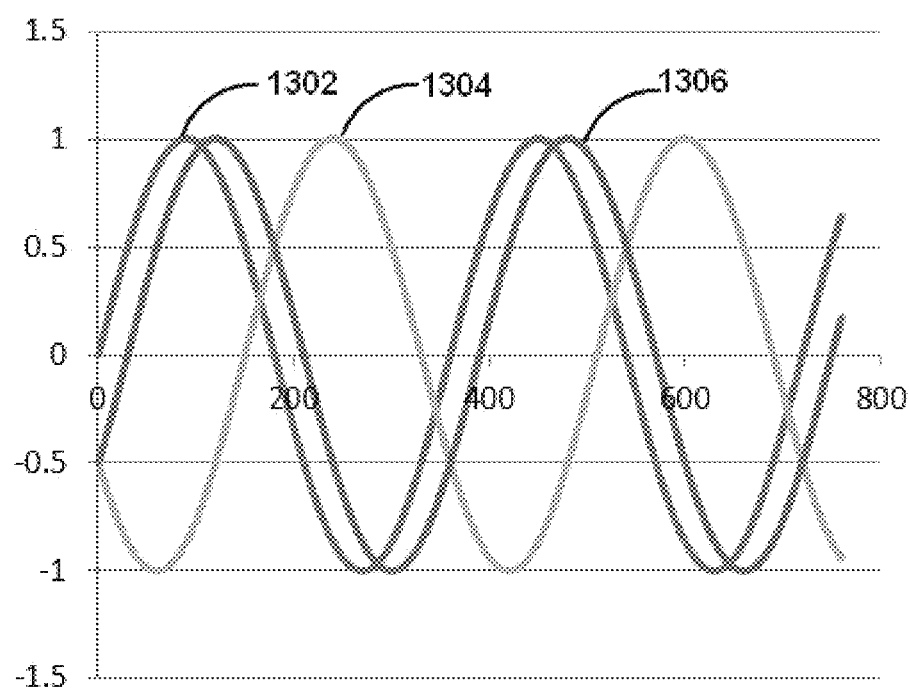
FIG. 10 is a graphic depiction of voltage on the transformer, the voltage across an energized capacitor on a different phase, and the resulting neutral CT current according to an embodiment of the presently described capacitor switch control system.

FIG. 10 depicts Voltage A 1302 with neutral CT current 1304 when the B switch and C switch are closed at separate times with rotation CBA. Note that the polarities of the two current phases 1204 and 120 with respect to voltage A have reversed. If, when switch A was closed, it was determined that the CT was inverted, the waveforms in FIGS. 9 and 10 will be reversed.

In operation, the following process is followed to determined rotation. First, switch A is closed. Next, it is determined if CT polarity is correct (current is leading) and the determination is stored. Next, switch A is opened and switch B is closed. If CT polarity was correct, then if neutral current is mostly the same polarity as voltage A, then the rotation is ABC. If not, then the rotation is CBA. If, on the other hand CT polarity was incorrect, if neutral current is mostly the same polarity as voltage A, then the rotation is CBA, otherwise the rotation is ABC. Next, switch B is opened. Then, switch C is closed and repeat procedure defined for switch B closure above noting that polarities are opposite. Finally, open switch C.

Figure 11:
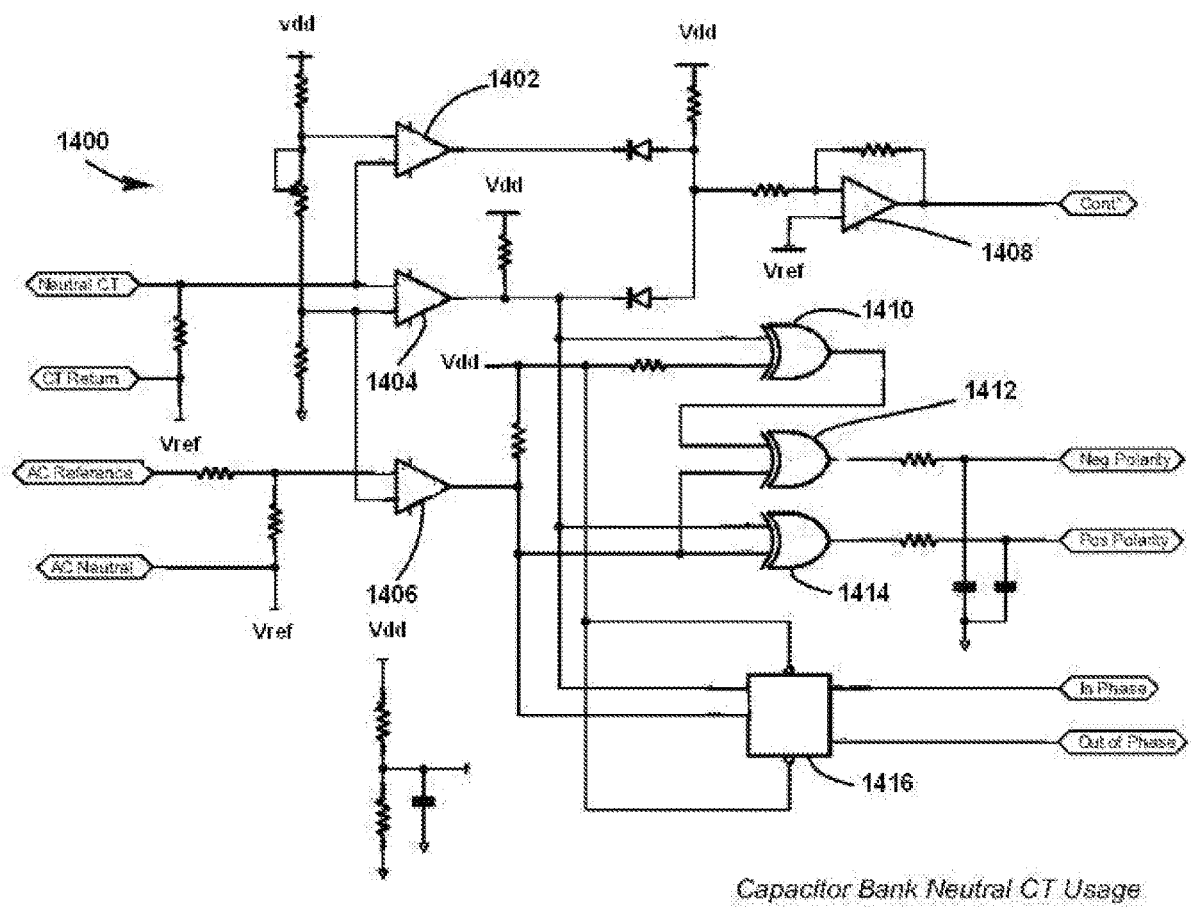
FIG. 11 is a circuit diagram for measurement and detection of switch calibration contact signals and phase rotation signals according to an embodiment of the presently described capacitor switch control system.

FIG. 11 is a circuit diagram reflecting an embodiment of both the Switch Calibration Contact Signal and the Phase Rotation Detection Signals. Comparators U1A 1402 and U1B 1404 detect either polarity of CT signal as the step function in neutral current caused by the closure of the capacitor switch occurs. Comparator U2B 1408 produces the Contact (Cont*) Signal required by a microprocessor.

D Flip-Flop U4A 1416 is clocked on the rising edge of the voltage square wave from comparator U2A 1406. If the current signal from comparator U1B 1404 is high at that time while the A phase switch is closed, the transformer and neutral CT are in phase. If not, they are out of phase. The signals In Phase or Out of Phase will tell the microprocessor whether the signals are correctly phased or not.

Comparators U1B 1404 and U2A 1406 feed neutral current and AC voltage square wave signals to exclusive OR gate U3C 1414. Exclusive OR gate U3A 1410 acts as in invertor to feed the inverted Neutral CT square wave to Exclusive OR gate U3B 1412 along with the non-inverted AC voltage square wave. As previously discussed, when either phase B or phase C switch is closed the resulting neutral current will be mostly in phase with the AC voltage or mostly 180 degrees out of phase. If it is mostly in phase, the Positive Polarity (Pos Polarity) signal will be high. If it is out of phase the Negative Polarity (Neg Polarity) signal will be high. These signals along with the phasing signals give the microprocessor the information it needs for determining phase rotation.

Figure 12:
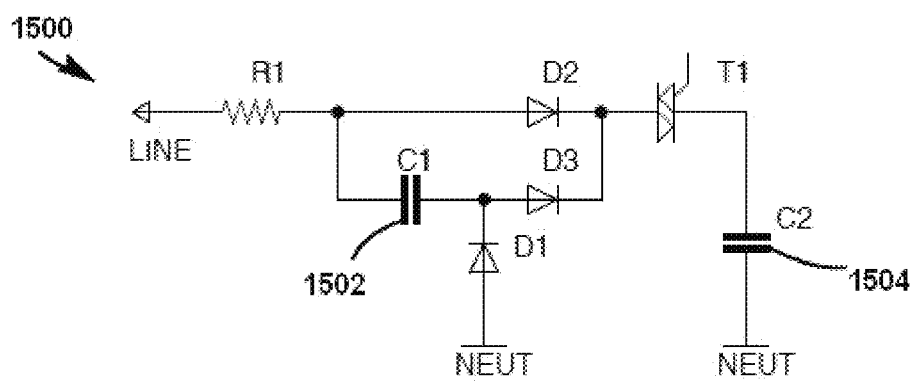
FIG. 12 is a voltage doubler and monitoring circuit according to an embodiment of the presently described capacitor switch control system.

FIG. 12 is a circuit diagram of a voltage doubler and monitoring circuit according to an embodiment of the present invention. The voltage doubler and monitoring circuit provide adequate voltage for both the closing and tripping capacitors in low voltage AC power conditions. As shown in FIG. 12, monitoring circuit 1500 includes a first capacitor 1502 and a second capacitor 1504. The arrangement of circuit 1500 provides adequate voltage to charge capacitor 1504 sing the input AC signal applied to 'LINE'. Capacitor 1504 is charged to a specific voltage and is used to operate the solenoid of a switch. This circuit is replicated to charge multiple capacitors for tripping and closing operations.

As generally illustrated herein, the system embodiments of the present disclosure can incorporate a variety of computer readable media that comprise computer usable medium having computer readable code means embodied therein. One skilled in the art will recognize that the software associated with the various processes described herein can be embodied in a wide variety of computer accessible media from which the software is loaded and activated. The present disclosure includes this type of computer readable media within its scope. The presently disclosed system anticipates a wide variety of variations in the basic theme of construction. The examples presented previously do not represent the entire scope of possible usages. They are meant to cite a few of the almost limitless possibilities. One skilled in the art will recognize that other embodiments are possible based on combinations of elements taught within the above description.

Although various embodiments of the present disclosure have been illustrated in the accompanying drawings and described in the foregoing Detailed Description, it will be understood that the present system is not limited to the embodiments disclosed, but is capable of numerous rearrangements, modifications, and substitutions without departing from the spirit of the system as set forth and defined herein.

The invention claimed is:

1. A control system, comprising:
a multiple phase power source;
a high voltage capacitor switch connected to the multiple phase power source;
a monitoring circuit comprising
 a monitoring capacitor,
 a monitoring solenoid,
 a monitoring solenoid coil, and
 a monitoring switch, wherein the monitoring solenoid moves to an initial contact with the monitoring switch and then to an end-of-travel with the monitoring switch;
a controller comprising in communication with the monitoring circuit;
at least 2 temperature sensors in communication with the controller to
 (1) measure and store a first capacitor temperature value of at least one of the plurality of capacitors inside the controller at closing;
 (2) measure and store a first solenoid temperature value of a solenoid of for the at least one of the plurality of capacitors;
a control circuit in communication with the controller configured for each phase of the multiple phase power source to determine a monitoring capacitor current in a neutral wire of a grounded wye capacitor bank;
a processor in communication with the controller associated with a non-transitory computer-readable medium to
 (1) generate one or more temperature curves based on the first capacitor temperature value and the first solenoid temperature value,
 (2) analyze the monitoring capacitor current to determine a first end-of-travel time for the monitoring solenoid to move to an initial contact with the monitoring switch; and
 (3) analyze the monitoring capacitor current to determine a second end of travel time of the monitoring solenoid to move to an end-of-travel of the monitoring switch;
 (4) calculate a regression constant from the difference in the first end-of-travel time and the second end of travel time; and
 (5) generate a corrected regression constant based on the one or more temperature curves; and
a voltage circuit in communication with the controller to provide a closing voltage to a closing capacitor based on the corrected regression constant received from the processor,
wherein the closing voltage causes the high voltage capacitor switch to close and electrically connect a respective phase of the multiple phase power source, and the voltage circuit provides a closing voltage to a closing capacitor of the control circuit according to the corrected regression constant based on the one or more temperature curves correction of the difference in the first end-of-travel time and the second end of travel time.

2. The control system claim 1, wherein the first end of travel time comprises a first time value in which the solenoid reaches an end of path of travel while at least one of the capacitor switches remains closed.

3. The control system of claim 1, wherein the second end of travel time comprises a second time value in which the solenoid reaches an end of path of travel while at least one of the capacitor switches remains closed.

4. The control system of claim 3, wherein the modified regression constant determined according to a second contact value that is the difference of the second full travel time and the second end of travel time.

5. The control system of claim 1, wherein the voltage circuit and the monitoring circuit provide voltage to a closing capacitor and a tripping capacitor of the control circuit when in low voltage AC power conditions.

6. The control system herein the control circuit is located remotely and externally from the high voltage capacitor switch.

7. The control system of claim 1, wherein the high voltage capacitor switch comprises 3 high voltage capacitor switch the 3 high voltage capacitor switch comprise a high voltage capacitor, high voltage solenoid and a high voltage switch.

8. The control system of claim 1, herein the high voltage capacitor switch comprises a first high voltage capacitor, a first high voltage solenoid and a first high voltage switch; a second high voltage capacitor, a second high voltage solenoid and a second high voltage switch; and a third high voltage capacitor, a third high voltage solenoid and a third high voltage switch.

9. The control system of claim 1, wherein the a monitoring circuit comprising a first monitoring capacitor, a first monitoring solenoid and a first monitoring switch; a second monitoring capacitor, a second monitoring solenoid and a second monitoring switch; and a third monitoring capacitor, a third monitoring solenoid and a third monitoring switch.

* * * * *